(12) United States Patent
Park et al.

(10) Patent No.: US 11,581,147 B2
(45) Date of Patent: Feb. 14, 2023

(54) ELECTRONIC COMPONENT

(71) Applicant: SAMSUNG ELECTRO-MECHANICS CO., LTD., Suwon-si (KR)

(72) Inventors: Heung Kil Park, Suwon-si (KR); Gu Won Ji, Suwon-si (KR); Sang Soo Park, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 10 days.

(21) Appl. No.: 17/229,932

(22) Filed: Apr. 14, 2021

(65) Prior Publication Data

US 2022/0189697 A1   Jun. 16, 2022

(30) Foreign Application Priority Data

Dec. 14, 2020   (KR) .......................... 10-2020-0174344

(51) Int. Cl.
| | |
|---|---|
| *H01G 4/30* | (2006.01) |
| *H01G 4/012* | (2006.01) |
| *H01G 4/008* | (2006.01) |
| *H05K 1/11* | (2006.01) |
| *H05K 1/16* | (2006.01) |

(Continued)

(52) U.S. Cl.
CPC .............. *H01G 4/30* (2013.01); *H01G 2/065* (2013.01); *H01G 4/008* (2013.01); *H01G 4/012* (2013.01); *H05K 1/0259* (2013.01); *H05K 1/112* (2013.01); *H05K 1/162* (2013.01)

(58) Field of Classification Search
CPC ...... H01G 4/1209; H01G 4/232; H01G 2/065; H01G 2/02; H01G 4/012; H01G 4/30; H01G 4/008; H05K 1/0259; H05K 1/112; H05K 1/162
See application file for complete search history.

(56) References Cited

U.S. PATENT DOCUMENTS

2010/0157505 A1* 6/2010 Feichtinger .............. H01G 4/40
                                                                          361/301.4
2013/0077199 A1* 3/2013 Ikeda ........................ H01T 4/12
                                                                          361/56

(Continued)

FOREIGN PATENT DOCUMENTS

| KR | 10-2018-0035440 A | 4/2018 |
|---|---|---|
| KR | 10-2019-0030635 A | 3/2019 |
| KR | 10-2019-0068082 A | 6/2019 |

*Primary Examiner* — Michael P McFadden
(74) *Attorney, Agent, or Firm* — Morgan, Lewis & Bockius LLP

(57) ABSTRACT

An electronic component includes: an ESD discharge member including a substrate having first and second surfaces opposing each other, first and second through-holes penetrating through the substrate, and first and second conductors; and a multilayer capacitor disposed on the first surface of the substrate, in which the multilayer capacitor may include: a capacitor body; and first and second external electrodes disposed outside the capacitor body and connected to the first and second conductors, respectively, and the first and second conductors may include first and second via electrodes coated on inner walls of the first and second through-holes, respectively.

27 Claims, 10 Drawing Sheets

(51) Int. Cl.
H05K 1/02 (2006.01)
H01G 2/06 (2006.01)

(56) References Cited

U.S. PATENT DOCUMENTS

| | | | |
|---|---|---|---|
| 2015/0340154 A1* | 11/2015 | Kim | H01G 2/22 |
| | | | 361/275.1 |
| 2016/0007446 A1* | 1/2016 | Ishikawa | H05K 1/181 |
| | | | 361/301.4 |
| 2018/0075975 A1* | 3/2018 | Hattori | H01G 4/232 |
| 2019/0066919 A1* | 2/2019 | Son | H01G 4/12 |
| 2019/0180945 A1* | 6/2019 | Kim | H01G 4/40 |
| 2021/0335547 A1* | 10/2021 | Yokomizo | H01G 4/1227 |

* cited by examiner

ELECTRONIC COMPONENT

CROSS-REFERENCE TO RELATED APPLICATION(S)

The present application claims the benefit of priority to Korean Patent Application No. 10-2020-0174344, filed on Dec. 14, 2020 in the Korean Intellectual Property Office, the disclosure of which is incorporated herein by reference in its entirety.

TECHNICAL FIELD

The present disclosure relates to an electronic component.

BACKGROUND

As the spread of electronic devices promoted by smartphones, such as the Internet of Things devices, increases, preparations for electrostatic discharge (ESD) caused by contact between a human body and electronic devices are becoming important.

SUMMARY

An aspect of the present disclosure provides an electronic component for effectively controlling ESD and a board having the same.

According to an aspect of the present disclosure, an electronic component includes: an ESD discharge member including a substrate having first and second surfaces opposing each other, first and second through-holes penetrating through the substrate, and first and second conductors; and a multilayer capacitor disposed on the first surface of the substrate. The multilayer capacitor may include: a capacitor body; and first and second external electrodes disposed outside the capacitor body and connected to the first and second conductors, respectively, and the first and second conductors may include first and second via electrodes coated on inner walls of the first and second through-holes, respectively.

According to another aspect of the present disclosure, a board having an electronic component includes: a printed circuit board having at least a pair of electrode pads disposed thereon; an electronic component disposed on the printed circuit board; and a solder connecting the pair of electrode pads and the electronic component. The electronic component may include: a multilayer capacitor including a capacitor body and first and second external electrodes disposed at two opposing ends of the capacitor body in a first direction; and an ESD discharge member disposed between the multilayer capacitor and the printed circuit board. The ESD discharge member may include: a substrate; first and second through-holes penetrating through the substrate; and first and second conductors respectively disposed in different regions of the substrate including inner walls of the first and second through-holes and respectively connected to the first and second external electrodes.

According to still another aspect of the present disclosure, an ESD discharge member including a substrate having first and second surfaces opposing each other, and first and second conductors disposed at least on the first surface of the substrate and spaced apart from each other in a first direction; and a multilayer capacitor disposed on the first surface of the substrate. The multilayer capacitor includes: a capacitor body; and first and second external electrodes disposed outside the capacitor body and connected to the first and second conductors, respectively, and each of the first and second conductors has a smaller width at an inner end portion than an outer end portion thereof, the inner and outer end portions being defined in the first direction.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
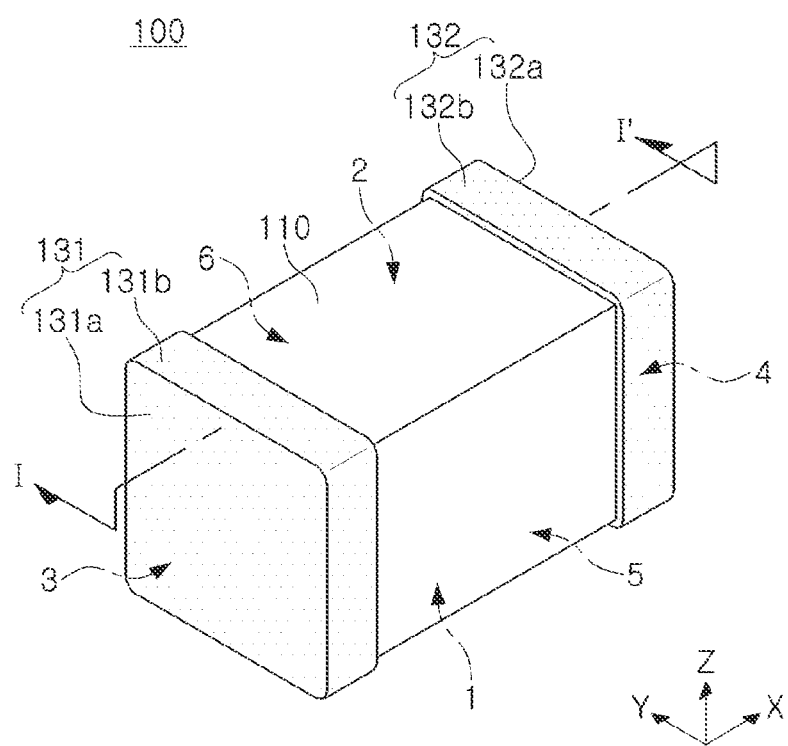
FIG. 1 is a perspective view schematically illustrating a multilayer capacitor applied to the present disclosure.

Hereinafter, exemplary embodiments of the present disclosure will now be described in detail with reference to the accompanying drawings.

Defining directions in order to clearly describe exemplary embodiments in the present disclosure, X, Y and Z in the drawings refer to a length direction, a width direction, and a thickness direction of a multilayer capacitor, an electronic component, and a board having the same, respectively.

In addition, in the present specification, a length direction may be used as the same concept as an X direction or a second direction, a width direction may be used as the same concept as a Y direction or a third direction, and a thickness direction may be used as the same concept as a Z direction, a first direction, or a stacking direction, respectively.

Electronic Component

Figure 2A:
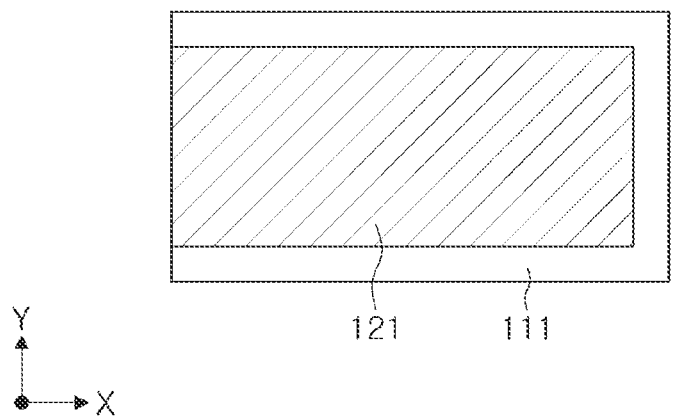
FIGS. 2A and 2B are plan views illustrating first and second internal electrodes included in the multilayer capacitor of FIG. 1, respectively.
Figure 2B:
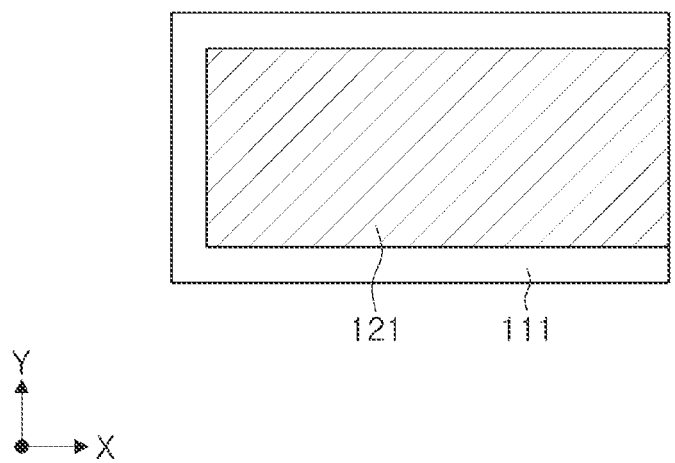
Figure 3:
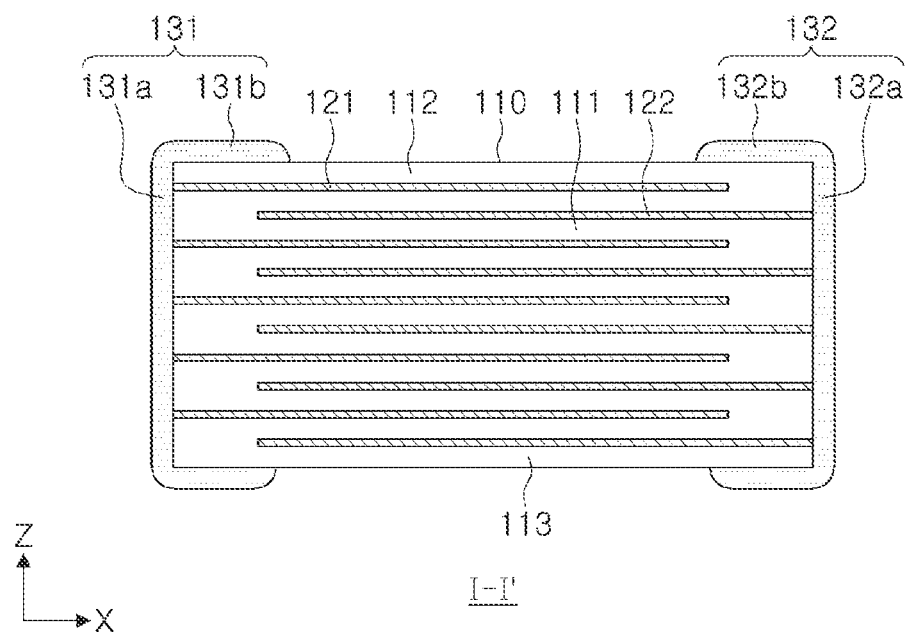
FIG. 3 is a cross-sectional view taken along line I-I' of FIG. 1.

FIG. 1 is a perspective view schematically illustrating a multilayer capacitor applied to the present disclosure, FIGS. 2A and 2B are plan views illustrating first and second internal electrodes included in the multilayer capacitor of FIG. 1, respectively, and FIG. 3 is a cross-sectional view taken along line I-I' of FIG. 1.

First, a structure of a multilayer capacitor 100 applied to an electronic component of an exemplary embodiment in the present disclosure will be described with reference to FIGS. 1 to 3.

The multilayer capacitor 100 according to the exemplary embodiment in the present disclosure may include a capacitor body 110 and first and second external electrodes 131 and 132 disposed outside the capacitor body 110.

The capacitor body 110 may be formed by stacking and then sintering a plurality of dielectric layers 111 in a Z direction, and adjacent dielectric layers 111 of the capacitor body 110 may be integrated with each other so that boundaries therebetween are not readily apparent without using a scanning electron microscope (SEM).

In addition, the capacitor body 110 may include the plurality dielectric layers 111 and a plurality of first and second internal electrodes 121 and 122 alternately disposed in the Z direction with each of the dielectric layers 111 interposed therebetween.

The capacitor body 110 may include an active part as a part contributing to the formation of the capacitance of the capacitor, and cover parts 112 and 113 respectively provided above and below the active region in the Z direction as a margin part.

A shape of the capacitor body 110 is not particularly limited, but may be a hexahedral shape, and the capacitor body 110 may have first and second surfaces 1 and 2 opposing each other in the Z direction, first to fourth surfaces 3 and 4 connected to the first and second surfaces 1 and 2 and opposing each other in an X direction, and fifth and sixth surfaces 5 and 6 connected to the first to fourth surfaces 1, 2, 3, and 4 and opposing each other in a Y direction.

A raw material for forming the dielectric layer 111 is not particularly limited as long as sufficient capacitance may be obtained. For example, a barium titanate-based material, a lead composite perovskite-based material, a strontium titanate-based material, or the like may be used.

In addition, a material forming the dielectric layer 111 may be a material in which adding various ceramic additives, organic solvents, plasticizers, binders, dispersants, and the like are added to powders such as barium titanate ($BaTiO_3$), according to an object of the present disclosure.

The plurality of internal electrodes 121 and 122 may include a first internal electrode 121 and a second internal electrode 122. The first and second internal electrodes 121 and 122, which are electrodes having different polarities, may be formed on the dielectric layers 111 and be stacked in the Z direction, and may be alternately arranged in the capacitor body 110 to face each other in the Z direction with each of the dielectric layers 111 interposed therebetween.

Here, the first and second internal electrodes 121 and 122 may be electrically insulated from each other by the dielectric layers 111 disposed therebetween.

In addition, one end of the first and second internal electrodes 121 and 122 may be exposed through the third and fourth surfaces 3 and 4, respectively.

The end portions of the first and second internal electrodes 121 and 122 alternately exposed through the third and fourth surfaces 3 and 4 of the capacitor body 110, respectively, may be electrically connected to first and second external electrodes 131 and 132 to be described below disposed at opposite end portions of a capacitor body 110 in the X direction, respectively.

According to the configuration as described above, when a predetermined voltage is applied to the first and second external electrodes 131 and 132, electric charges may be accumulated between the first and second internal electrodes 121 and 122. In this case, the capacitance of the multilayer capacitor 100 may be in proportion to an overlapped area of the first and second internal electrodes 121 and 122 overlapping each other in the Z direction in an active region.

In addition, the material forming the first and second internal electrodes 121 and 122 is not particularly limited, and the first and second internal electrodes 121 and 122 may be formed of a conductive paste formed of one or more of, for example, a noble metal material, such as a platinum (Pt), palladium (Pd), and a palladium-silver (Pd—Ag) alloy, nickel (Ni), and copper (Cu).

In this case, the method of printing the conductive paste may include a screen printing method, a gravure printing method, or the like, but the present disclosure is not limited thereto.

The first and second external electrodes 131 and 132 may be disposed at both ends of the capacitor body 110 in the X direction, respectively, and may include first and second head parts 131a and 132a disposed on the third and fourth surfaces 3 and 4 of the capacitor body 110, respectively, and first and second band parts 131b and 132b extending from the first and second head parts 131a and 132a to portions of the first, second, fifth, and sixth surfaces 1, 2, 5, and 6 of the capacitor body 110.

Voltages having different polarities may be provided to the first and second external electrodes 131 and 132, respectively, and the first and second external electrodes 131 and 132 may be electrically connected to the exposed end portions of the first and second internal electrodes 121 and 122, respectively.

The first external electrode 131 may include a first head part 131a and a first band part 131b. The first head part 131a may be disposed on the third surface 3 of the capacitor body 110, and may be in contact with the end portions of the first internal electrode 121 externally exposed through the third surface 3 of the capacitor body 110 to serve to electrically connect the first internal electrode 121 and the first external electrode 131 to each other. Here, the first band part 131b may be a part extending from the first head part 131a to portions of the first, second, fifth, and sixth surfaces 1, 2, 5, and 6 of the capacitor body 110 in order to improve adhesion strength, or the like.

The second external electrode 132 may include a second head part 132a and a second band part 132b. The second head part 132a may be disposed on the fourth surface 4 of the capacitor body 110, and may be in contact with the end portion of the second internal electrode 122 externally exposed through the fourth surface 4 of the capacitor body 110 to serve to electrically connect the second internal electrode 122 and the second external electrode 132 to each other. Here, the second band part 132b may be a part extending from the second head part 132a to portions of the first, second, fifth, and sixth surfaces 1, 2, 5, and 6 of the capacitor body 110 in order to improve adhesion strength, or the like.

The material of the external electrodes 131 and 132 is not particularly limited as long as it has electrical conductivity such as a metal, and a specific material may be determined in consideration of electrical characteristics, structural stability, and the like. In addition, the external electrodes 131 and 132 may have a multilayer structure as needed.

The external electrodes 131 and 132 may be a plastic electrode containing a conductive metal and glass, or a resin-based electrode containing a conductive metal and resin. In addition, a material having excellent electrical conductivity may be used as a conductive metal included in the external electrodes 131 and 132, and is not particularly limited. For example, the conductive metal may be one or more of nickel (Ni), copper (Cu), and alloys thereof.

Meanwhile, the first and second external electrodes 131 and 132 may further include plating layers. The plating layers may include first and second nickel (Ni) plating layers and first and second tin (Sn) plating layers covering, respectively, the first and second nickel plating layers.

Figure 4:
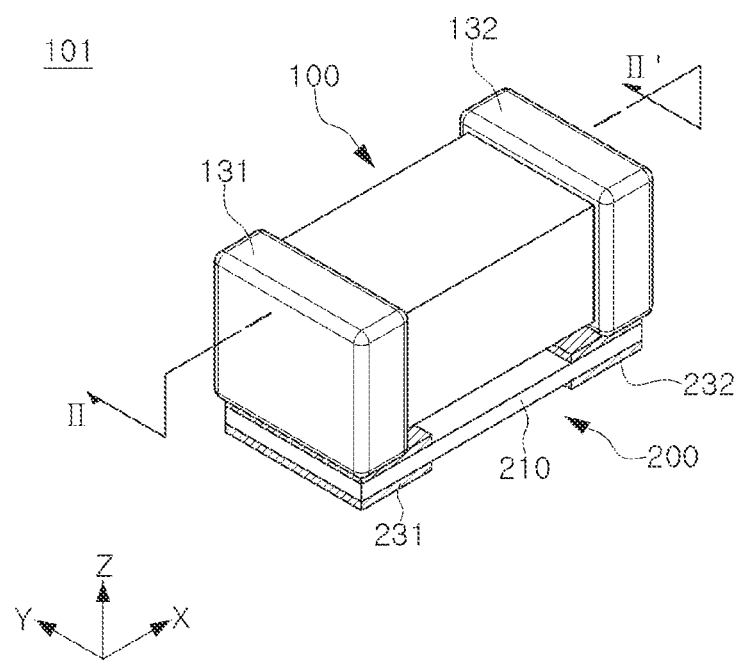
FIG. 4 is a perspective view schematically illustrating an electronic component according to an exemplary embodiment in the present disclosure.
Figure 5:
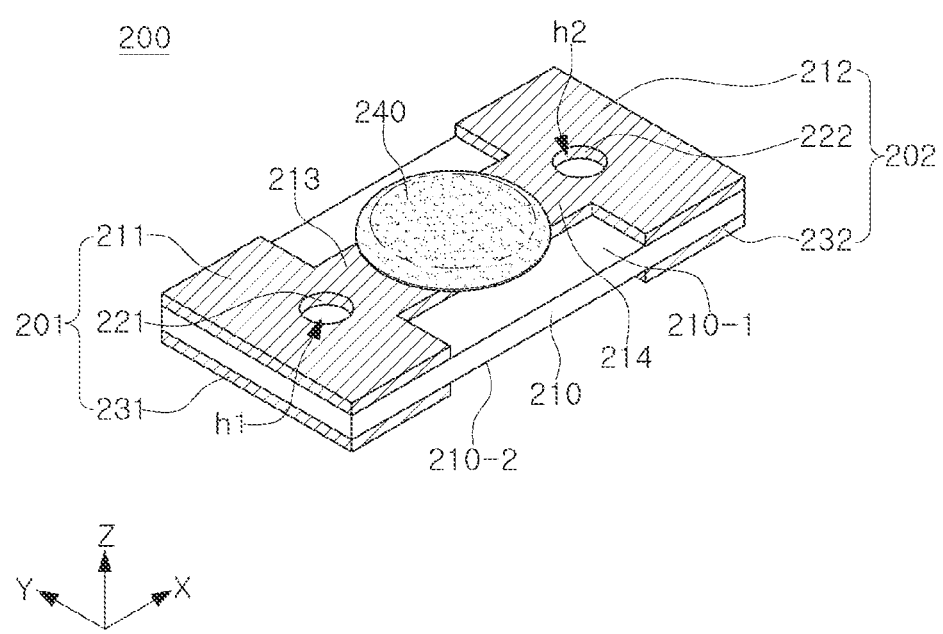
FIG. 5 is a perspective view of an ESD discharge member of FIG. 4.
Figure 6A:
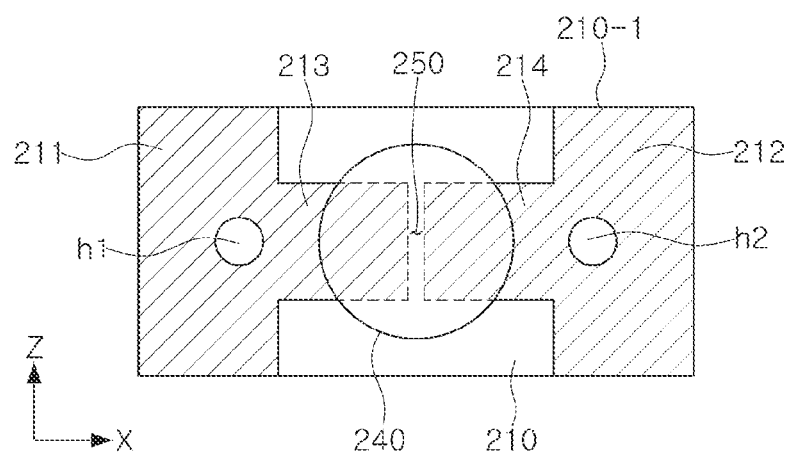
FIGS. 6A and 6B is a plan view and a bottom view in a Z direction of FIG. 5.
Figure 6B:
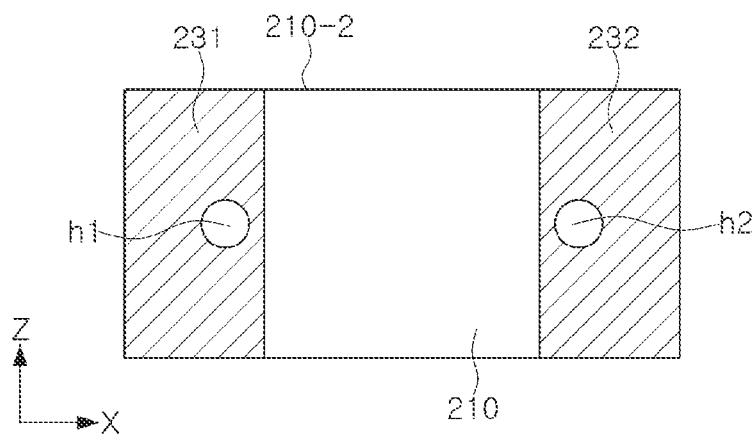
Figure 7:
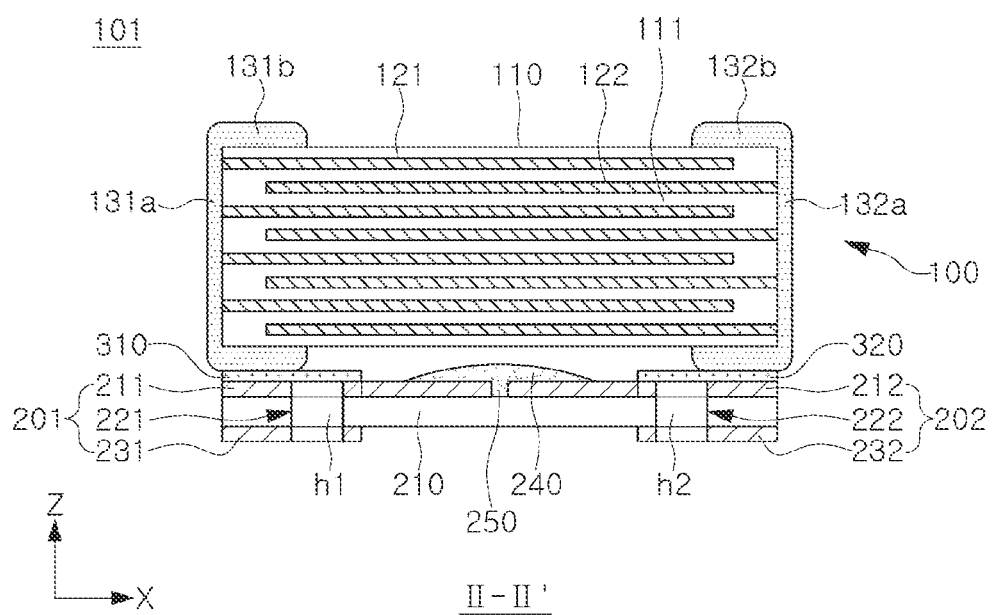
FIG. 7 is a cross-sectional view taken along line II-II' of FIG. 4.

FIG. 4 is a perspective view schematically illustrating an electronic component according to an exemplary embodiment in the present disclosure, FIG. 5 is a perspective view of an ESD discharge member of FIG. 4, FIGS. 6A and 6B are a plan view and a bottom view in a Z direction of FIG. 5, and FIG. 7 is a cross-sectional view taken along line II-II' of FIG. 4.

Referring to FIGS. 4 to 7, an electronic component 101 according to an exemplary embodiment in the present disclosure includes the multilayer capacitor 100 and an ESD discharge member 200.

The ESD discharge member 200 may be disposed on one surface of the multilayer capacitor 100, and in particular, may be disposed on one of the first, second, fifth and sixth surfaces 1, 2, 5, and 6 of the capacitor body 110. That is, the ESD discharge member 200 may be disposed on one surface in contact with the first and second band parts 131b and 132b.

Here, The ESD discharge member 200 may be smaller in length and width than the multilayer capacitor 100. That is, as illustrated in FIG. 4, the ESD discharge member 200 may be disposed inside an outermost point of the multilayer capacitor 100 on which the first and second external electrodes 131 and 132 are formed, and thus, may be disposed so that some area thereof overlaps the first and second external electrodes 131 and 132 in the Z direction, respectively.

The ESD discharge member 200 may include a substrate 210 having first and second surfaces 210-1 and 201-2 opposing each other, first and second through-holes h1 and h2 penetrating through the substrate 210, and first and second conductors 201 and 202.

In this case, the multilayer capacitor 100 may be disposed on the first surface 210-1 of the substrate, and the first and second external electrodes 131 and 132 may be connected to the first and second conductors 201 and 202, respectively.

The substrate 210 may be formed of a high-rigidity material, and may be formed of, for example, alumina. However, this is only an example, and therefore, the material of the substrate 210 is not limited thereto.

The first surface 210-1 of the substrate may be disposed to be contact with one surface of the multilayer capacitor 100. The second surface 210-2 of the substrate becomes a mounting surface in contact with the printed circuit board when the electronic component 101 is mounted on the printed circuit board.

The first and second conductors 201 and 202 may be formed to be symmetrical to each other in the X direction, and may be connected to the first and second external electrodes 131 and 132, respectively. In addition, when the electronic component 101 is mounted on the printed circuit board, the first and second conductors 201 and 202 may be connected to electrode pads of the printed circuit board, respectively, to connect the multilayer capacitor 100 and the printed circuit board to each other.

The first and second conductors 201 and 202 may be formed by printing a conductive paste on the substrate 210, in which the conductive paste is at least one of nickel (Ni), copper (Cu), tin (Sn), or alloys thereof. However, the present disclosure is not limited thereto, and the first and second conductors 201 and 202 may be formed by dipping or may be formed using other methods such as plating.

Further, as illustrated in FIGS. 4 to 7, the first and second conductors 201 and 202 may be formed to protrude from the first and second surfaces 210-1 and 210-2 of the substrate, and, if necessary, it may be formed flatly to the same height as the surface.

When the first and second conductors 201 and 202 are formed at the same height as the surfaces of the first and second surfaces 210-1 and 210-2 of the substrate, the substrate 210 may have a predetermined step in a thickness direction with respect to an area in which the first and second conductors 201 and 202 are provided.

The first and second conductors 201 and 202 may include a first emission electrode layers 211 and 212 disposed on the first surface 210-1 of the substrate to be spaced apart from each other and connected to the first and second external electrodes 131 and 132, respectively, and first and second lower electrode layers 231 and 232 disposed on a second surface 210-2 of the substrate to be spaced apart from each other.

Further, first and second through-holes h1 and h2 may be formed on the substrate 210 to be symmetrical to each other in the X direction, and the first and second conductors 201 and 202 may include first and second via electrodes 221 and 222 coated on inner walls of the first and second through-holes h1 and h2, respectively. For example, the first and second via electrodes 221 and 222 may not fill entire spaces of the first and second through-holes h1 and h2, respectively.

The first conductor 201 may be disposed close to the third surface 3 of the capacitor body 110 and may include a first emission electrode layer 211, a first via electrode 221, and a first lower electrode layer 231.

The first through-hole h1 may be formed to penetrate the first emission electrode layer 211, the substrate 210, and the first lower electrode layer 231. The first via electrode 221 coated on the inner wall of the first through-hole h1 may connect the first emission electrode layer 211 and the first lower electrode layer 231 to each other.

In other words, the first conductor 201 may integrally include the first via electrode 221 and may be disposed to cover some area of the first and second surfaces 210-1 and 210-2 of the substrate.

The second conductor 202 may be disposed close to the fourth surface 4 of the capacitor body 110 and may include a second emission electrode layer 212, a second via electrode 222, and a second lower electrode layer 232.

The second through-hole h2 may be formed to penetrate the second emission electrode layer 212, the substrate 210, and the second lower electrode layer 232. The second via electrode 222 coated on the inner wall of the second through-hole h2 may connect the second emission electrode layer 212 and the second lower electrode layer 232 to each other.

In other words, the second conductor 202 integrally includes the second via electrode 222 and may be disposed to cover some area of the first and second surfaces 210-1 and 210-2 of the substrate. In this case, the second conductor 202 may be disposed to be spaced apart from the first conductor 201.

Referring to FIGS. 6A and 6B, the first and second conductors 201 and 202 may be formed asymmetrically on the first surface 210-1 and the second surface 210-2 of the substrate, respectively. That is, the shape of the first and second emission electrode layers 211 and 212 disposed on the first surface 210-1 of the substrate and the shape of first and second lower electrode layers 231 and 232 disposed on the second surface 210-2 of the substrate may be different.

The shapes of the first and second emission electrode layers 211 and 212 disposed on the first surface 210-1 of the substrate may vary, but for example, as illustrated in FIG.

6A, each of the first and second emission electrode layers 211 and 212 may have a "T" shape. In this case, the first and second emission electrode layers 211 and 212 may be disposed so that portions having a narrow width in the Y direction in the "T" shape face each other. Each of the first and second emission electrode layers 211 and 212 may have a smaller width at an inner end portion than an outer end portion of the first and second emission electrode layers 211 and 212, where the inner and outer end portions are defined in the X direction.

In other words, the first and second conductors 201 and 202 may each be formed to extend from opposite both ends of the first surface 210-1 of the substrate toward the center thereof.

Hereinafter, in the present specification, portions of the first and second emission electrode layers 211 and 212 disposed to face each other in the center of the first surface 210-1 of the substrate will be described by being defined as first and second extension parts 213 and 214.

Therefore, when the first and second emission electrode layers 211 and 212 having the 'T' shape are used, the first and second extension parts 213 and 214 may be formed to have a smaller width than the substrate 210.

The first and second emission electrode layers 211 and 212 may include the first and second extension parts 213 and 214 each extending from opposite both ends of the first surface 210-1 of the substrate toward the center thereof. In addition, a space portion 250 may be provided between the first and second extension parts 213 and 214.

That is, the first and second extension parts 213 and 214 may be disposed on the first surface 210-1 of the substrate to be symmetrical to each other in the X direction, but may be spaced apart from each other by a predetermined distance from the center of the substrate 210 to form a space portion 250.

The space portion 250 may serve as ESD by passing. A gap between the first and second extension parts 213 and 214 of the space portion 250 serves to determine an ESD turn-on voltage, and may preferably be 1 to 20 µm. Here, the turn-on voltage refers to a voltage through which high-voltage static electricity passes to the lead electrode due to the ESD operation.

The ESD discharge member 200 may further include an ESD function part 240. The ESD function part 240 may be formed on the first surface 210-1 of the substrate to cover a portion of the first and second emission electrode layers 211 and 212 and the space portion 250. In other words, the ESD function part 240 may be disposed to cover one end of the first conductor 201 and one end of the second conductor 202 together.

The ESD function part 240 may be formed by printing an ESD paste on the substrate 210, in which the ESD paste may be a mixture of a conductive material and an insulating material.

The conductive material included in the ESD paste may include at least one conductive metal of copper (Cu), silver (Ag), palladium (Pd), tin (Sn), nickel (Ni), and gold (Au), or may be a compound thereof, and the present disclosure is not limited thereto.

The insulating material included in the ESD paste may correspond to a resin such as epoxy, for example, and the present disclosure is not limited thereto.

Meanwhile, as another example, the ESD function part 240 may include a conductive polymer. The conductive polymer may have characteristics of a non-conductor when a signal voltage input from a signal interface, an integrated circuit (IC) block of a power supply terminal, or a communications line through which signals are transferred from a connector to a system or an IC corresponds to a rated voltage (circuit voltage) level, but may have characteristics of a conductor when an over-voltage such as ESD, or the like, is instantaneously generated.

The shapes of the first and second lower electrode layers 231 and 232 disposed on the second surface 210-2 of the substrate may vary, but for example, as illustrated in FIG. 6B, each of the first and second lower electrode layers 231 and 232 may have an "I" shape. The first and second lower electrode layers 231 and 232 may be disposed to be spaced apart from each other in the X direction without forming an extension part.

In addition, the first and second lower electrode layers 231 and 232 may be disposed so that at least some area thereof overlaps the first and second emission electrode layers 211 and 212, respectively, in the Z direction.

Additionally, according to the exemplary embodiment of the present disclosure, the first and second conductors 201 and 202 may not be formed on a side surface perpendicular to the first and second surfaces 210-1 and 210-2 of the substrate. That is, the first and second conductors 201 and 202 may be formed on the first and second surfaces 210-1 and 210-2 of the substrate and the inner walls of the first and second through-holes h1 and h2, but may not be formed on both side surfaces of the substrate 210 in the X direction and both sides in the Y direction.

The multilayer capacitor may be an open circuit in a DC power supply, but when cracks occur inside the capacitor body due to the external environment, internal electrodes overlap each other or a current path occurs, and as a result, defects occur due to a short circuit. The defects due to the short circuit cause an overcurrent to flow into unwanted lines, which adversely affect other parts.

Conventionally, by increasing the margin of the external electrode in which cracks are likely to occur due to an external force, the multilayer capacitor is designed so that the short circuit between both electrodes of the internal electrode do not occur even if cracks occur. In this case, however, the area of the internal electrode that implements the capacitance may relatively decrease as the margin increases.

According to the exemplary embodiment in the present disclosure, by attaching the ESD discharge member 200 to one side of the multilayer capacitor 100 to provide the ESD by passing function such as an ESD suppressor, the ESD protection function may be implemented without changing the design of the internal electrodes of the multilayer capacitor.

In addition, according to the exemplary embodiment of the present disclosure, by adjusting the distance (space portion 250) between the first and second emission electrode layers 211 and 212 and adjusting the content of the conductive particles forming the ESD function part 240, the voltage may be adjusted accordingly.

Referring to FIG. 7, the electronic component 101 according to the exemplary embodiment in the present disclosure may further include conductive bonding layers 310 and 320 each disposed between the first and second external electrodes 131 and 132 and the ESD discharge member 200.

The multilayer capacitor 100 and the ESD discharge member 200 may be coupled through the first and second conductive bonding layers 310 and 320. In this case, the first and second emission electrode layers 211 and 212 may be connected to the first and second external electrodes 131 and 132, respectively, via the conductive bonding layers 310 and 320.

The first and second conductive bonding layers 310 and 320 may bond a portion of the first and second emission electrode layers 211 and 212 and a portion of the first and second band parts 131b and 132b to each other. In this case, the first and second conductive bonding layers 310 and 320 may cover at least a portion of the first and second through-holes h1 and h2, and may be disposed only in a portion where first and second through-holes h1 and h2 is not formed.

The first and second conductive bonding layers 310 and 320 may include a conductive metal and a resin, and thus, may electrically connect between the first and second external electrodes 131 and 132 and the first and second conductors 201 and 202 and improve the adhesion between the multilayer capacitor 100 and the ESD discharge member 200 to increase the adhesion strength. However, the material is not limited thereto, and any material having conductivity and bonding properties may be used without limitation.

(Embodiments)

Figure 8:
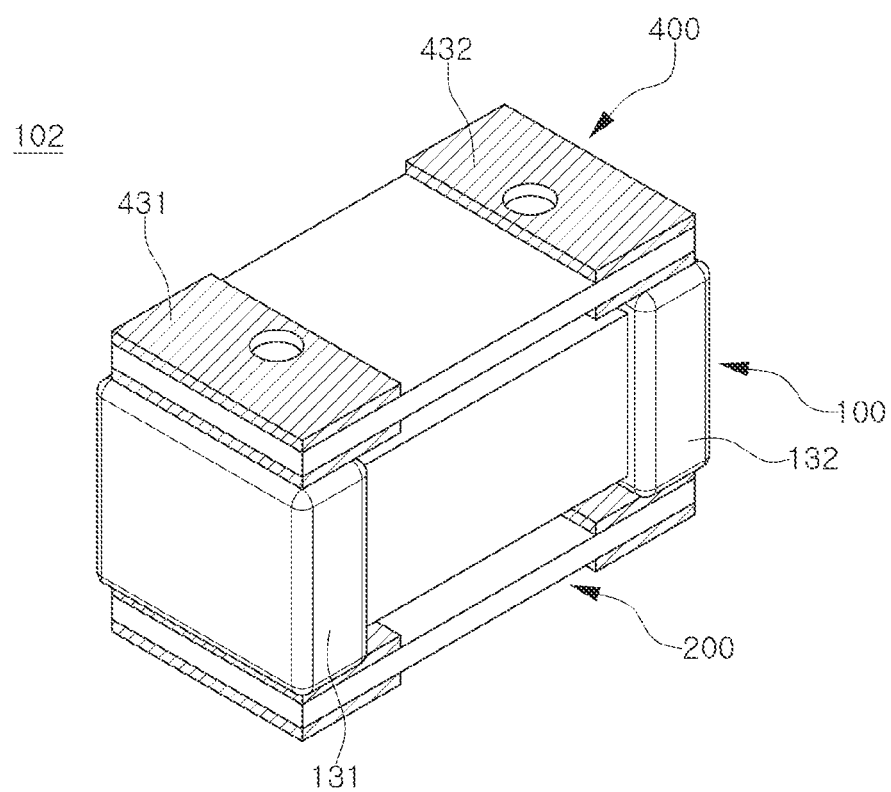
FIGS. 8 and 9 are perspective views schematically illustrating an electronic component according to another exemplary embodiment in the present disclosure.
Figure 9:
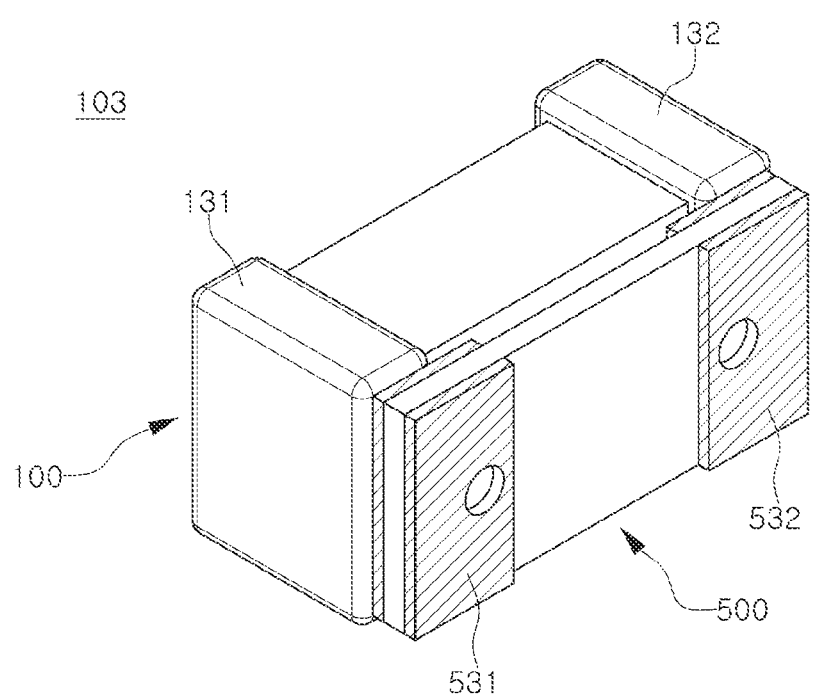

FIGS. 8 and 9 are perspective views schematically illustrating an electronic component according to another exemplary embodiment in the present disclosure.

Hereinafter, various embodiments of an electronic component including one or a plurality of ESD discharge members will be described with reference to FIGS. 4 to 9.

First, in the case of an exemplary embodiment in which one ESD discharge member 200 is coupled to the multilayer capacitor 100, the ESD discharge member 200 may be coupled to one surface of a side on which the first, second, fifth and sixth surfaces 1, 2, 5, and 6 of the capacitor body 110 are disposed.

As an exemplary embodiment, as illustrated in FIG. 4, the ESD discharge member 200 may be coupled to be contact with one surface on a side on which the first surface of the capacitor body 110 is disposed, that is, the mounting surface of the multilayer capacitor 100.

In the case of the exemplary embodiment, when the electronic component 101 is mounted on the printed circuit board, the ESD discharge member 200 may be disposed between the multilayer capacitor 100 and the printed circuit board. In addition, a solder for fixing the electronic component 101 on the printed circuit board may be disposed between the second surface 210-2 of the substrate of the ESD discharge member 200 and the printed circuit board.

In this case, some of the solder applied to the second surface 210-2 of the substrate may be introduced into inner spaces of the first and second through-holes h1 and h2 provided in the substrate 210. When the solder is disposed while filling a portion of the first and second through-holes h1 and h2 as described above, a bonding area between the solder and the ESD discharge member 200 is widened, so that the adhesion between the printed circuit board and the electronic component 101 may be increased.

Meanwhile, unlike the foregoing, the ESD discharge member 200 may be contact with the other surface different from the mounting surface of the multilayer capacitor 100. For example, like an electronic component 103 of the exemplary embodiment illustrated in FIG. 9, one ESD discharge member 500 may be coupled to one surface of a side on which the fifth surface 5 of the capacitor body 110 is disposed. In this case, first and second lower electrode layers 531 and 532 disposed on the second surface of the substrate of the ESD discharge member 500 may be coupled to face the outside of the multilayer capacitor 100.

In the case of the exemplary embodiment in which a plurality of ESD discharge members 200 are coupled to the multilayer capacitor 100, the plurality of ESD discharge members 200 may each be coupled to two or more surfaces of the surfaces on which the first, second, fifth and sixth surfaces 1, 2, 5, and 6 of the capacitor body 110 are disposed.

In other words, the ESD discharge member 200 according to the exemplary embodiment in the present disclosure may include the plurality of ESD discharge members, and the plurality of ESD discharge members may be disposed on at least two of the surfaces of the multilayer capacitor 100 in contact with the first and second band parts 131b and 132b, respectively.

In this case, the number of ESD discharge members coupled to one multilayer capacitor 100 is not particularly limited, and positions at which the plurality of ESD discharge members are disposed are also not particularly limited.

As an exemplary embodiment, as illustrated in FIG. 8, each of the ESD discharge members 200 and 400 may be disposed on surfaces of the multilayer capacitor 100 opposing each other.

For example, one ESD discharge member 200 may correspond to a high voltage ESD discharge member 200 disposed on one side surface perpendicular to the mounting surface of the multilayer capacitor 100. In addition, another ESD discharge member 400 may correspond to a low voltage ESD discharge member 400 disposed opposite to the high voltage ESD discharge member 200 on the other side surface perpendicular to the mounting surface of the multilayer capacitor 100.

In this way, when the low voltage ESD discharge member 400 is disposed on one side of the multilayer capacitor 100 and the high voltage ESD discharge member 200 is disposed on the opposite side thereof, it may be applied to electronic components having a wider range of ESD voltage.

However, the plurality of ESD discharge members are not necessarily disposed on opposite surfaces of the multilayer capacitor 100 as described above, and may be freely selected and disposed on two or more of the surfaces on which the first, second, fifth and sixth surfaces 1, 2, 5, and 6 of the capacitor body 110 are disposed.

In addition, by freely disposing the ESD discharge member on each side of the multilayer capacitor 100, the space utilization of electronic components mounted on the printed circuit board may be increased.

Board Having Electronic Component

Figure 10:
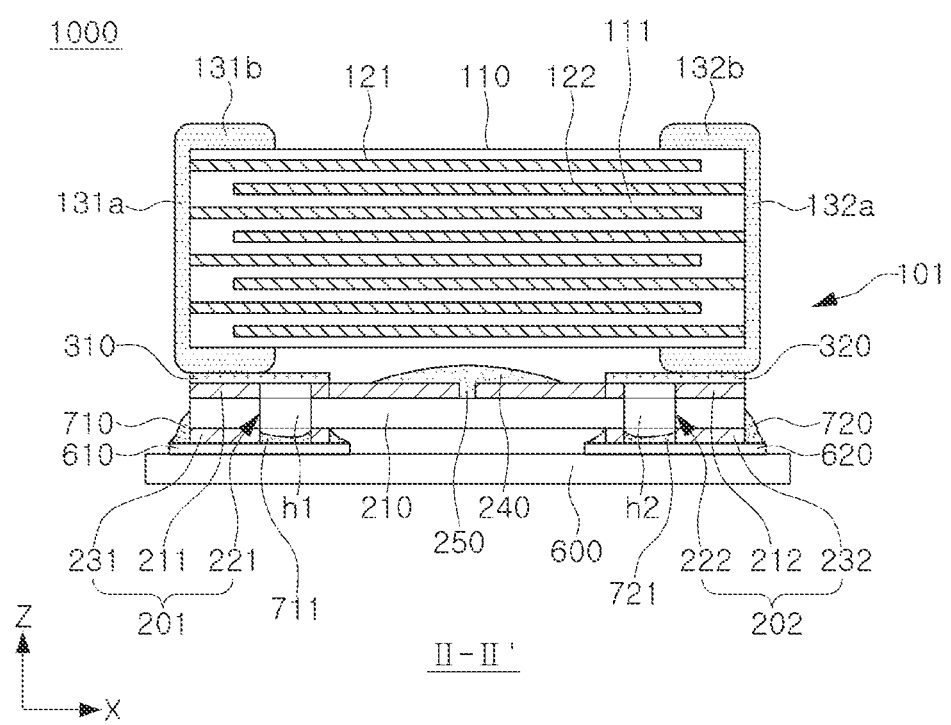
FIG. 10 is a cross-sectional view illustrating an exemplary embodiment in which an electronic component of FIG. 7 is disposed on a printed circuit board.
Figure 11:
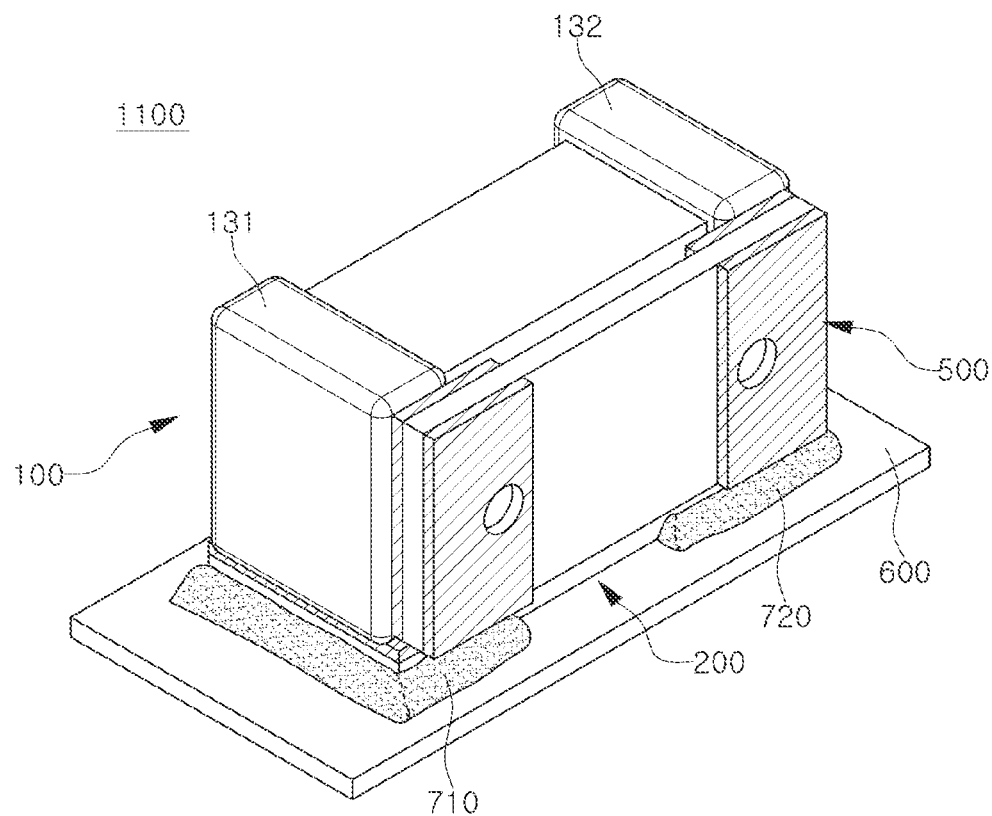
FIG. 11 is a perspective view schematically illustrating an exemplary embodiment in which the ESD discharge member is additionally included in the electronic component of FIG. 10.

FIG. 10 is a cross-sectional view illustrating an exemplary embodiment in which an electronic component of FIG. 7 is disposed on a printed circuit board, and FIG. 11 is a perspective view schematically illustrating an exemplary embodiment in which the ESD discharge member is additionally included in the electronic component of FIG. 10.

Referring to FIG. 10, a board 1000 of an electronic component according to the exemplary embodiment in the present disclosure may include a printed circuit board 600 having at least a pair of electrode pads 610 and 620 provided thereon, an electronic component 101 provided on the printed circuit board 600, and solders 710 and 720 connecting the electrode pads 610 and 620 and the electronic component 101.

The pair of electrode pads 610 and 620 may include first and second electrode pads 610 and 620 connected to the first and second conductors 201 and 202 of the ESD discharge member 200 in the electronic component 101, respectively.

In this case, in a state in which the first and second lower electrode layers 231 and 232 of the first and second conductors 201 and 202 are in contact with each of the first and second electrode pads 610 and 620, the printed circuit board 600 and the ESD discharge member 200 may be connected to each other by the solders 710 and 720.

The solders 710 and 720 may be disposed to cover various areas, but for example, as illustrated in FIG. 10, may be disposed between the pair of electrode pads 610 and 620 and the first and second lower electrode layers 231 and 232, respectively.

In addition, the solders 710 and 720 may be disposed to fill at least a portion of the inner spaces of the first and second through-holes h1 and h2. In this case, the volume and shape of the solders 711 and 721 disposed in the inner space of the first and second through-holes h1 and h2 may be various, and each of the solders 711 and 721 may be formed irregularly while having a different volume and shape.

As described above, the solders 711 and 721 may be disposed to fill at least a portion of the inner spaces of the first and second through-holes h1 and h2, and thus, a contact area between the solders 710 and 720 that bonds the printed circuit board 600 including the pair of electrode pads 610 and 620 and the ESD discharge member 200 to each other may be increased, so the adhesion of the electronic component 101 may be further improved.

By partially filling the through-holes h1 and h2 provided in the first and second lower electrode layers 231 and 232 with the conductive solders 710 and 720, the electrical connectivity of the first and second conductors 201 and 202 may also be improved.

However, in the exemplary embodiment in the present disclosure, the solders 711 and 721 are not necessarily disposed in the inner spaces of the first and second through-holes h1 and h2, and the exemplary embodiments in which only one of the solders 711 and 721 may be disposed or both thereof may not disposed are also possible.

Additionally, the solders 710 and 720 may not be in contact with the multilayer capacitor 100. That is, the solders 710 and 720 may be formed only in the lower region of the side surfaces of the ESD discharge member 200 in the first and second directions, and may not be formed further upward. Accordingly, the solders 710 and 720 may not contact the first and second external electrodes 131 and 132 of the multilayer capacitor 100 positioned above the ESD discharge member 200.

A relatively strong attractive force may act on the first and second lower electrode layers 231 and 232 having similar materials to the solders 710 and 720, while a relatively weak attraction force may act on the substrate 210 of the ESD discharge member 200 having a different material from the solders 710 and 720.

Accordingly, it is possible to suppress the solders 710 and 720 from rising toward the side surface of the substrate 210 in the first and second directions, and reduce the amount of vibration transmitted to the printed circuit board 600 by the solders 710 and 720. In addition, since a piezoelectric stress is directly transmitted from the multilayer capacitor 100 to the printed circuit board 600 through the first and second external electrodes 131 and 132, an effect of reducing acoustic noise may be improved.

On the other hand, even if the solders 710 and 720 are in contact with the multilayer capacitor 100, the contact area may be narrow. For example, when the amount of solder applied to the upper portion of the printed circuit board 600 is large, the solders 710 and 720 may rise along the side surfaces of the substrate 210 in the first and second directions.

Even in such a case, in the exemplary embodiment of the present disclosure, since the solders 710 and 720 reach the multilayer capacitor 100 through the ESD discharge member 200, the contact area of the solders 710 and 720 and the multilayer capacitor 100 may be formed to be smaller than a conventional electronic component that does not include an ESD discharge member.

In addition, in the case of the exemplary embodiment of the present disclosure, since the amount of solder fillet formed around the electronic component may be reduced, the amount of vibration transmitted to the printed circuit board 600 may be reduced, thereby reducing the acoustic noise.

Referring to FIG. 11, a board 1100 of an electronic component may include a plurality of ESD discharge members 200 and 500. That is, the ESD discharge members may be disposed on at least two surfaces of the multilayer capacitor 100, respectively.

As described in FIG. 10, a board 1100 of the electronic component according to the present embodiment may also include the printed circuit board 600 having at least a pair of electrode pads provided thereon, the electronic component provided on the printed circuit board 600, and the solders 710 and 720 connecting the pair of electrode pads and the electronic component.

The electronic component may include a plurality of ESD discharge members, and the plurality of ESD discharge members may be disposed on two or more surfaces selected from both end surfaces of the capacitor body in the second direction and both end surfaces of the capacitor body in the third direction.

In this case, the electronic component may include the ESD discharge member 200 disposed between the multilayer capacitor 100 and the printed circuit board 600, and the ESD discharge member 500 further disposed on at least one of the remaining three surfaces.

In this way, by disposing the plurality of ESD discharge members 200 and 500 in the multilayer capacitor 100, the ESD prevention effect may be further increased, and the ESD control effect may be adjusted depending on the applied voltage, the capacitance of the multilayer capacitor, or the like.

On the other hand, since the exemplary embodiment illustrated in FIG. 11 is only an example, the ESD discharge member may be disposed on three surfaces selected from both end surfaces of the capacitor body in the second direction and both end surfaces of the capacitor body in the third direction, respectively, and the ESD discharge member may be disposed on the four surfaces, respectively.

In the exemplary embodiment including the plurality of ESD discharge members as described above, as described with reference to FIG. 10, the solders 710 and 720 may be disposed to fill at least a portion of the inner spaces of the first and second through-holes of the ESD discharge member 200. In this case, the volume and shape of the solder disposed in the inner spaces of the first and second through-holes may vary, and each solder may be irregularly formed while having a different volume and shape.

In addition, the solders 710 and 720 may not be in contact with the multilayer capacitor 100. That is, the solders 710 and 720 may be formed only in the lower region of the side surfaces of the ESD discharge member 200 in the first and second directions, and may not be formed further upward. Accordingly, the solders 710 and 720 may not contact the first and second external electrodes 131 and 132 of the multilayer capacitor 100 positioned above the ESD discharge member 200, and may not contact another ESD discharge member 500.

As set forth above, according to an exemplary embodiment in the present disclosure, the ESD discharge member may be disposed on the mounting surface of the multilayer capacitor, so the ESD of the multilayer capacitor may effectively control.

In addition, according to an exemplary embodiment in the present disclosure, the ESD discharge member may be selectively disposed on at least one of both end surfaces in the second direction and both end surfaces in the third direction of the multilayer capacitor, so the space utilization of the electronic components mounted on the substrate may increase.

In addition, according to an exemplary embodiment in the present disclosure, a plurality of ESD discharge members may be disposed together in one multilayer capacitor, so the ESD control effect may be adjusted according to the applied voltage, the capacitance of the multilayer capacitor, or the like.

While exemplary embodiments have been shown and described above, it will be apparent to those skilled in the art that modifications and variations could be made without departing from the scope of the present invention as defined by the appended claims.

What is claimed is:

1. An electronic component, comprising:
   an ESD discharge member including a substrate having first and second surfaces opposing each other, first and second conductors, and first and second through-holes penetrating through the substrate and the first and second conductors,
   wherein the first conductor includes a first emission electrode layer disposed on the first surface of the substrate and the second conductor includes a second emission electrode layer disposed on the first surface of the substrate,
   the first emission electrode layer includes a first part on which the first through-hole is formed and a first extension part extending from the first part toward a center of the substrate and the second emission electrode layer includes a second part on which the second through-hole is formed and a second extension part extending from the second part toward the center of the substrate, and
   a width of the first extension part and the second extension part is narrower than a width of the first part and the second part;
   a multilayer capacitor disposed on the first surface of the substrate,
   wherein the multilayer capacitor includes:
      a capacitor body; and
      first and second external electrodes disposed outside the capacitor body and connected to the first and second conductors, respectively, and
   wherein the first and second conductors include first and second via electrodes coated on inner walls of the first and second through-holes, respectively; and
   first and second conductive bonding layers disposed on the first and second parts of the first and second emission electrode layers except the first and second through-holes formed on the first and second parts.

2. The electronic component of claim 1, wherein the first conductor includes the first via electrode, and is disposed to cover some area of the first and second surfaces of the substrate, and
   wherein the second conductor includes the second via electrode, and is disposed to cover some area of the first and second surfaces of the substrate and be spaced apart from the first conductor.

3. The electronic component of claim 1, wherein the first and second conductors each extend from opposing two ends of the first surface of the substrate toward the center thereof, and has a space portion therebetween.

4. The electronic component of claim 1, wherein the first and second conductors are not disposed on side surfaces perpendicular to the first and second surfaces of the substrate.

5. The electronic component of claim 1, wherein
   the first emission electrode layer and the second emission electrode layer are connected to the first and second external electrodes, respectively, and the first and second conductors further comprise:
   first and second lower electrode layers disposed on the second surface of the substrate to be spaced apart from each other, a shape of the first and second emission electrode layers is different from a shape of the first and second lower electrode layers,
   a space between the first emission electrode layer and the second emission electrode layer is narrower than a space between the first lower electrode layer and the lower emission electrode layer.

6. The electronic component of claim 5, wherein the first through-hole penetrates through the first emission electrode layer, the substrate, and the first lower electrode layer, and the second through-hole penetrates through the second emission electrode layer, the substrate, and the second lower electrode layer, and
   wherein the first via electrode connects the first emission electrode layer and the first lower electrode layer to each other, and the second via electrode connects the second emission electrode layer and the second lower electrode layer to each other.

7. The electronic component of claim 5, wherein the first and second emission electrode layers each extend from opposite two ends of the first surface of the substrate toward the center thereof.

8. The electronic component of claim 5, wherein the first and second extension part has a narrower width than the substrate.

9. The electronic component of claim 8, wherein the first and second conductors are not disposed on side surfaces perpendicular to the first and second surfaces of the substrate.

10. The electronic component of claim 1, wherein the ESD discharge member has a smaller length and width than the multilayer capacitor.

11. The electronic component of claim 1,
    wherein the ESD discharge member further includes an ESD function part disposed to cover a space portion formed between the first extension part and the second extension part and portions of the first extension part and the second extension part, the ESD function part includes a conductive polymer.

12. The electronic component of claim 1, wherein the capacitor body includes first and second surfaces opposing each other, third and fourth surfaces connected to the first and second surfaces and opposing each other, and fifth and sixth surfaces connected to the first to fourth surfaces and opposing each other, and one ends of first and second internal electrodes are exposed through the third and fourth surfaces, respectively, and
    wherein the first and second external electrodes include first and second head parts disposed on the third and fourth surfaces of the capacitor body, respectively, and first and second band parts extending from the first and second head parts onto portions of the first, second, fifth, and sixth surfaces of the capacitor body and connected to the first and second conductors, respectively.

13. The electronic component of claim 12, wherein the ESD discharge member is disposed on one surface of the multilayer capacitor in contact with the first and second band parts.

14. The electronic component of claim 12, wherein the ESD discharge member is provided in plural, and disposed on at least two surfaces, respectively, among surfaces of the multilayer capacitor in contact with the first and second band parts.

15. A board having an electronic component, comprising:
a printed circuit board having at least a pair of electrode pads disposed thereon;
an electronic component disposed on the printed circuit board; and
a solder connecting the pair of electrode pads and the electronic component,
wherein the electronic component includes:
a multilayer capacitor including a capacitor body and first and second external electrodes disposed at two opposing ends of the capacitor body in a first direction; and
an ESD discharge member disposed between the multilayer capacitor and the printed circuit board, and
wherein the ESD discharge member includes:
a substrate;
first and second through-holes penetrating through the substrate; and
first and second conductors respectively disposed in different regions of the substrate including inner walls of the first and second through-holes and respectively connected to the first and second external electrodes,
the first conductor includes a first emission electrode layer disposed on a first region of a first surface of the substrate and the second conductor includes a second emission electrode layer disposed on a second region of the first surface of the substrate,
the first emission electrode layer includes a first part on which the first through-hole is formed and a first extension part extending from the first part toward a center of the substrate and the second emission electrode layer includes a second part on which the second through-hole is formed and a second extension part extending from the second part toward the center of the substrate,
a width of the first extension part and the second extension part is narrower than a width of the first part and the second part, and
the ESD discharge member includes first and second conductive bonding layers disposed on the first and second parts of the first and second emission electrode layers except the first and second through-holes formed on the first and second parts.

16. The board of claim 15, wherein the first conductor includes a first lower electrode layer disposed on a third region of a second surface of the substrate, the second conductor includes a second lower electrode layer disposed on a fourth region of the second surface of the substrate, the first and second surface opposing each other, the solder is disposed between the second surface and the printed circuit board so that the solder is disposed to fill at least a portion of inner spaces of the first and second through-holes formed on the second surface.

17. The board of claim 15, wherein the solder is not in contact with the multilayer capacitor.

18. The board of claim 15, wherein the electronic component includes a plurality of ESD discharge members, and
wherein the plurality of ESD discharge members are disposed on two or more surfaces selected from two opposing end surfaces of the capacity body in a second direction perpendicular to the first direction and two opposing end surfaces of the capacity body in a third direction perpendicular to the first and second directions.

19. An electronic component, comprising:
an ESD discharge member including a substrate having first and second surfaces opposing each other, and first and second conductors disposed at least on the first surface of the substrate and spaced apart from each other in a length direction of the substrate,
wherein the first conductor includes a first emission electrode layer disposed on the first surface and a first lower electrode layer disposed on the second surface,
the second conductor includes a second emission electrode layer disposed on the first surface and a second lower electrode layer disposed on the second surface,
the first emission electrode layer includes a first outer portion and a first inner portion extending from the first outer portion toward a center of the substrate and the second emission electrode layer includes a second outer portion and a second inner portion extending from the second outer portion toward the center of the substrate,
first and second through-holes penetrating the first and second conductors and the substrate are formed on the first and second outer portions which are wider than the first and second inner portions in a width direction of the substrate,
the ESD discharge member further includes an ESD function part disposed to cover a space portion formed between the first extension part and the second extension part and portions of the first extension part and the second extension part, and
a width of the ESD function part is larger than a width of the first inner portion and the second inner portion in the width direction of the substrate; and
a multilayer capacitor disposed on the first surface of the substrate,
wherein the multilayer capacitor includes:
a capacitor body; and
first and second external electrodes disposed outside the capacitor body and connected to the first and second conductors, respectively.

20. The electronic component of claim 19, wherein
the first and second conductors include first and second via electrodes coated on inner walls of the first and second through-holes, respectively.

21. The electronic component of claim 20, wherein the first and second via electrodes do not fill entire spaces of the first and second through-holes, respectively.

22. The electronic component of claim 20, wherein
the first emission electrode layer and the second emission electrode layer are connected to the first and second external electrodes, respectively; and
a shape of the first and second emission electrode layers is different from a shape of the first and second lower electrode layers, a space between the first emission electrode layer and the second emission electrode layer is narrower than a space between the first lower electrode layer and the lower emission electrode layer.

23. The electronic component of claim 22, wherein the first through-hole penetrates through the first emission electrode layer, the substrate, and the first lower electrode layer, and the second through-hole penetrates through the second emission electrode layer, the substrate, and the second lower electrode layer, and wherein the first via electrode connects the first emission electrode layer and the first lower electrode layer to each other, and the second via electrode connects the second emission electrode layer and the second lower electrode layer to each other.

24. The electronic component of claim 19, wherein the ESD function part includes a conductive polymer.

25. The electronic component of claim 24, wherein the ESD function part includes an ESD paste which is a mixture of a conductive material and an insulating material.

26. The electronic component of claim 19, wherein the capacitor body includes first and second surfaces opposing each other, third and fourth surfaces connected to the first and second surfaces and opposing each other, and fifth and sixth surfaces connected to the first to fourth surfaces and opposing each other, and one ends of first and second internal electrodes are exposed through the third and fourth surfaces, respectively, and wherein the first and second external electrodes include first and second head parts disposed on the third and fourth surfaces of the capacitor body, respectively, and first and second band parts extending from the first and second head parts onto portions of the first, second, fifth, and sixth surfaces of the capacitor body and connected to the first and second conductors, respectively.

27. The electronic component of claim 26, wherein the ESD discharge member is provided in plural, and disposed on at least two surfaces, respectively, among surfaces of the multilayer capacitor in contact with the first and second band parts.

* * * * *